United States Patent [19]

Eastwood et al.

[11] Patent Number: 4,651,095

[45] Date of Patent: Mar. 17, 1987

[54] METHODS OF PRODUCING IMAGES BY NMR TECHNIQUES

[75] Inventors: Linda M. Eastwood; James M. S. Hutchison, both of Aberdeen, Scotland; Glyn Johnson, London, England; Thomas W. T. Redpath, Aberdeen, Scotland; Robert D. Selbie, Aberdeen, Scotland; John R. Mallard, Aberdeen, Scotland

[73] Assignee: National Research Development Corporation, London, England

[21] Appl. No.: 636,857

[22] Filed: Aug. 1, 1984

[30] Foreign Application Priority Data

Aug. 1, 1983 [GB] United Kingdom ................. 8320653

[51] Int. Cl.⁴ .......................................... G01R 33/20
[52] U.S. Cl. ..................................... 324/307; 324/312
[58] Field of Search ............... 324/307, 309, 312, 300; 364/726

[56] References Cited

U.S. PATENT DOCUMENTS

| | | | |
|---|---|---|---|
| 4,070,611 | 1/1978 | Ernst | 324/309 |
| 4,165,479 | 8/1979 | Mansfield | 324/309 |
| 4,355,282 | 10/1982 | Young et al. | 324/309 |
| 4,567,440 | 1/1986 | Haselgrove | 324/309 |

FOREIGN PATENT DOCUMENTS

| | | | |
|---|---|---|---|
| 2079463 | 1/1982 | United Kingdom | 324/309 |
| 2079946 | 1/1982 | United Kingdom | 324/309 |

OTHER PUBLICATIONS

"Fast Multiplier-Accumulators Implement FFT Butterflies", *Electronic Design*, Feb. 19, 1981, pp. 141–146.

Primary Examiner—Stewart J. Levy
Assistant Examiner—Kevin D. O'Shea
Attorney, Agent, or Firm—Cushman, Darby & Cushman

[57] ABSTRACT

A set of NMR free induction signals generated in nuclei in a sample are recorded in the presence of a magnetic field gradient to a static magnetic field in which the sample is positioned. Prior to recording a magnetic field gradient orthogonal to the said gradient is applied to phase-encode the signals. The individual signals of a set are differentiated by being recorded after different time integrals of the phase encoding gradient. The magnitudes of successive time integrals have a non-monotonic relationship with each other so that sufficient signal data is recorded to enable the Fourier transform operation to commence before half or less of the set of signals has been recorded. Preferably the relationship between the magnitudes of successive time integrals corresponds to a numerical sequence represented by a monotonic sequence of binary numbers re-arranged in bit-reversed order.

3 Claims, 2 Drawing Figures

METHODS OF PRODUCING IMAGES BY NMR TECHNIQUES

FIELD OF THE INVENTION

This invention relates to methods of producing images of samples by NMR techniques. More particularly, it relates to methods in which free induction signals generated by gyromagnetically excited nuclei in a sample are coded so that a two (or more) dimensional Fourier transform of a set of signals yields an image of spin density distribution or relaxation time.

BACKGROUND OF THE INVENTION

In U.S. Pat. Nos. 4,070,611 and 4,165,479, and in British patent publication Nos. 2,079,946 and 2,079,463, there are described methods of producing images by a series of free induction signals, such that a Fourier transformation of the recorded data yields the image. Each signal is normally frequency-coded in one dimension by the application of a magnetic field gradient to the static magnetic field in which the sample is placed during signal recording. This gradient causes signal frequency to vary with position in the gradient direction. If a set of time-samples of one signal, S(m) for m=0 to M−1, is recorded, then a one-dimensional distribution P(k) of spins (or their properties) in the object is given by the discrete Fourier transform of the signal.

$$P(k) = c \left| \sum_{m=0}^{M-1} S(m) \exp(-2\pi jkm) \right| \quad (1)$$

where c is some scaling factor.

Further, during the evolution of each free induction signal, second (or more) orthogonal gradients are switched on and off to give specific time-integrals of gradient. If, for example, a gradient $G_z$ has been applied over time T, then, in the recorded signal, phase depends on z as: $\phi_z = \gamma z \int G_z dt$ where $\gamma$ is the gyromagnetic ratio of the nuclei This method of spatial coding is referred to herein as "phase encoding". The signal recording may occur more than once after each spin-excitation. In this case, time T is the total time for which $G_z$ has been applied since the last excitation.

After phase-encoding, decoding requires a set of signals with different imposed phase-twist. Continuing the above example, to produce an image of MxN independent pixels, it is necessary to take M samples from each of N signals. Each of the N signals is recorded after a different integral of $G_z$, so that, for example, $$\int_T G_z dt = D[n - (N+1)/2], \quad n = 0, 1, \ldots, N-1 \quad (3)$$

where D is constant. The matrix P(k,l) giving spin-distribution in two dimensions in the sample is given by the two-dimensional discrete Fourier transform of the sampled signals S(m,n).

$$P(k,l) = c \left| \sum_{n=0}^{N-1} \left[ \sum_{m=0}^{M-1} S(m,n) \exp(-2\pi jkm) \right] \exp(-2\pi jln) \right| \quad (4)$$

It may be seen that the set of N phase-encoded signals is decoded in the same way as the set of M frequency-coded samples. Whereas the evolution of the M samples occurs in real time, the N samples for a single value of m may be regarded as evolving in "pseudo-time". The method can be extended in more dimensions. (An LxMxN image, for instance, requires M samples from each of LxN signals.) The data in each phase-encoded dimension can be regarded as evolving in a "pseudo-time".

The data described is normally collected following several spin excitations rather than just one. It is normal to leave some spin-recovery period between excitation.

One of the problems associated with the Fourier transform methods described above is that most of the data-processing (the Fourier transformation) is left until all data has been collected despite time being available between sample exitations during the data-collection sequence. This can greatly increase the total time between starting data-collection and observing a completed image. The delay involved is due to the fact that Fourier transformation is carried out only when all the relevant data points have been acquired. In the 2-dimensional example of equation (4), for instance, each M-point transform (within square brackets) may be carried out as soon as the M samples of the relevant signals have been acquired, but the N-point transform cannot be started until more than N/2 signals have been recorded.

SUMMARY OF THE INVENTION

It is an object of the invention to provide a method of producing images involving Fourier transform operations wherein at least some of the Fourier transform can be carried out before completion of the recording of all the free induction signals.

Accordingly the present invention comprises a method of producing images by NMR techniques in which a set of free induction signals are generated in nuclei in a sample and are recorded in the presence of a magnetic gradient field superimposed on a static magnetic field in which the sample is positioned, the individual signals of the set being differentiated from each other by being recorded after different time integrals of a magnetic field gradient orthogonal to said superimposed gradient magnetic field and are subject to a Fourier transform operation to derive a spin density distribution wherein the magnitudes of successive time integrals have a non-monotonic relationship with each other so that sufficient signal data is recorded to enable the Fourier transform operation to commence before half or less of the set of signals has been recorded.

A monotonic relationship is one where successive magnitudes have steadily increasing or decreasing values.

Preferably the relationship between the magnitudes of successive time integrals corresponds to a numerical sequence represented by a monotonic sequence of binary numbers rearranged in bit-reversed order.

The gradient field that is applied may be a resultant gradient field formed of two or more component gradient magnetic fields each orthogonal to each other and each having a gradient direction parallel to or orthogonal to the direction of the static magnetic field. One or more of the component gradient magnetic fields may have a constant value maintained during recordal of the free induction signals in order to directionally encode each signal in the direction of the constant value gradient.

Each or any value of gradient time integral, or each or any sequence of gradient time integrals may be repeated either to allow signal averaging or to code a differently excited signal or both.

Bit-reversal is carried out by reversing the order of the bits of numbers in binary form. Thus for a set of n numbers from 0 to N−1 bit-reversal is carried out by mirroring bits 0 to K−1 of the binary coded numbers about their centres, where K is the logarithm to the base 2 of N. Bit-reversal is normally employed in fast Fourier transform (FFT) algorithms. A table of a sequence of bit-reversed numbers for the case where N=8 is set out as follows:

BRIEF DESCRIPTION OF THE DRAWINGS

| Monotonic sequence | Binary-coded | Bit-reversal | Bit-reversed sequence |
|---|---|---|---|
| 0 | 000 | 000 | 0 |
| 1 | 001 | 100 | 4 |
| 2 | 010 | 010 | 2 |
| 3 | 011 | 110 | 6 |
| 4 | 100 | 001 | 1 |
| 5 | 101 | 101 | 5 |
| 6 | 110 | 011 | 3 |
| 7 | 111 | 111 | 7 |

In order that the invention may be more fully understood reference will now be made to the accompanying drawings in which.

DETAILED DESCRIPTION OF THE INVENTION

The MxN data-point example given above is again considered. If phase-encoding is in bit-reversed order, then the "pseudo-time" in which each set of N samples appears to have evolved is seen to occur in bit-reversed order. A fast Fourier transform algorithm can then be implemented to build up the N-point transforms progressively as each of the N signals is acquired.

Figure 1:
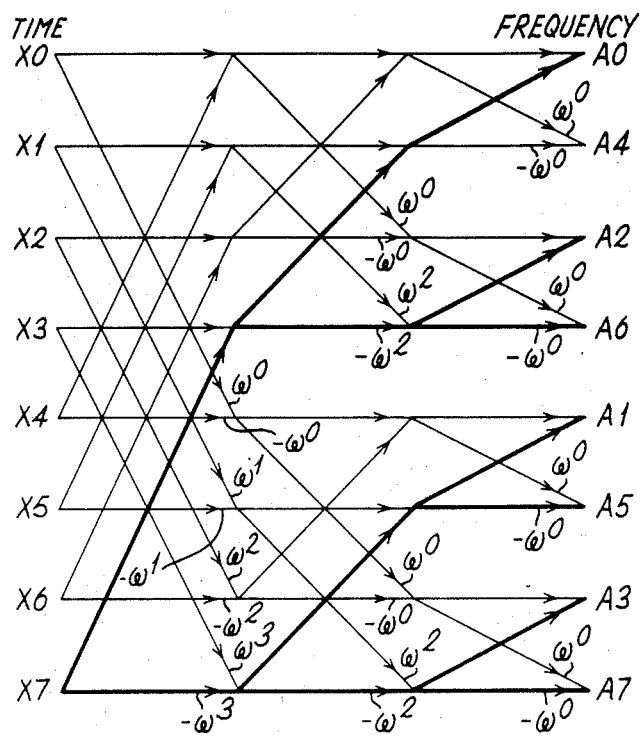
FIG. 1 represents the computational sequence for a FFT for a monotonically ordered sequence of signals.
Figure 2:
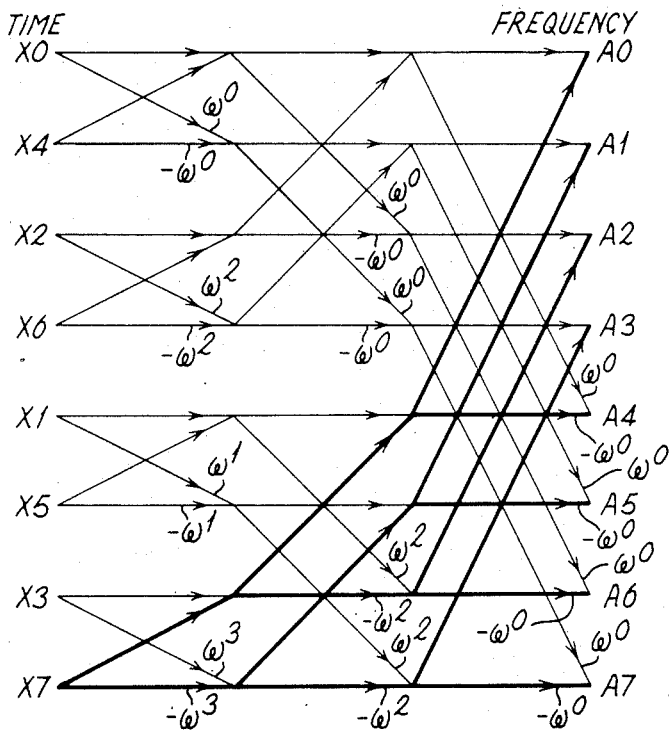
FIG. 2 represents the computational sequence for a FFT for a bit-reversed ordered sequence of signals.

FIGS. 1 and 2 show FFT flowcharts and FIG. 1 is typical of those normally encountered. Each shows an 8-point transform, and comprises 12 similar operations commonly known as "butterflies", each affecting two data values and involving 2 additions and 2 multiplications. In both FIGS. 1 and 2 it may be seen that the number of butterflies in which the final data-value is involved is 7. More generally, if the total number of data-points in the FFT is $N=2^K$, then the number of butterflies which cannot be carried out until all data is acquired is given by $$\sum_{i=1}^{K} 2^{(K-i)} = N - 1,$$

as compared with a total number of butterflies given by $$\sum_{i=1}^{K} 2^{(K-i)}, = (N/2)\log_2 N$$

In either case, if a suitable algorithm is used, then only a fraction $2(N-1)/(N \log_2 N)$ of the butterflies need, in theory, be left until the end.

The advantage of the scheme shown in FIG. 2 lies not in the number of butterflies left at the end, but in the distribution of execution of the remaining butterfies throughout data-collection. For the scheme of FIG. 1 for instance, the "node-spacing" (the separation between bufferfly pairs) is initially N/2, so that no calculation may be performed until at least 1+(N/2) data points, that is to say more than half of the data points, have been obtained. The number of bufferflies that may be carried out as each data-point is acquired is 0, 0, 0, 0, 1, 1, 3, 7. In the FIG. 2 scheme, by contrast, node spacing for the first transformation of the data array is only 1, and the distribution of butterfly-execution can be 0, 1, 0, 3, 0, 1, 0, 7. Using input data in bit-reversal order, calculation of butterflies is distributed fairly evenly over data-input time, making it easier to finish all but the N−1 "last-point" butterflies before the end of the data-collection.

Other similar orders of "pseudo-time", such as obtained by reversing bits and then, for instance, swapping input-butterfly pairs, or completely reversing the sequence, would achieve the same objective. Any ordering which gives initial node-spacing significantly less than N/2 permits a better distributed data-processing scheme than that possible with monotonically ordered data.

Another advantage of bit-reversed (or similar) data is that it obviates the need for bit-reverse sorting of data after collection, thus speeding up data-processing.

It should be noted that FFT algorithms using bit-reversed time data are already used. A feature of the invention is in making the data actually occur in bit-reversed order, rather than having to sort it after it has all been collected.

What is claimed is:

1. A method of producing images by NMR techniques comprises the steps of:
    generating a set of free induction signals from nuclei in a sample;
    recording the signals in the presence of a magnetic gradient field superimposed on a static magnetic field in which the sample is positioned;
    differentiating the signals from each other by recording after different time integrals of a magnetic field gradient orthogonal to the superimposed gradient magnetic field; and
    subjecting the recorded signals to a Fourier transform operation to derive a spin density distribution wherein the magnitudes of successive time integrals have a non-monotonic relationship with each other so that sufficient signal data is recorded to enable the Fourier transform operation to commence before half or less of the set of signals has been recorded.

2. The method as claimed in claim 1 in which the relationship between the magnitudes of successive time integrals corresponds to a numerical sequence represented by a monotonic sequence of binary numbers re-arranged in bit-reversed order.

3. The method as claimed in claim 1 in which any one or more successive values of gradient time integral are repeated.

* * * * *